(12) United States Patent
Jousset et al.

(10) Patent No.: US 9,331,215 B2
(45) Date of Patent: May 3, 2016

(54) HALOGEN-FREE, FIREPROOF, TRANSPARENT THERMOPLASTIC COMPOSITIONS HAVING HIGH THERMOMECHANICAL STRENGTH, IN PARTICULAR FOR ENCAPSULATION IN PHOTOVOLTAIC MODULES

(75) Inventors: Dominique Jousset, Bougival (FR); Jean-Jacques Flat, Goupillieres (FR); Pierre Georlette, Omer (IL)

(73) Assignee: ARKEMA FRANCE, Colombes (FR)

( * ) Notice: Subject to any disclaimer, the term of this patent is extended or adjusted under 35 U.S.C. 154(b) by 213 days.

(21) Appl. No.: 13/879,959

(22) PCT Filed: Oct. 18, 2011

(86) PCT No.: PCT/FR2011/052430
§ 371 (c)(1),
(2), (4) Date: Jun. 10, 2013

(87) PCT Pub. No.: WO2012/052677
PCT Pub. Date: Apr. 26, 2012

(65) Prior Publication Data
US 2013/0247983 A1 Sep. 26, 2013

(30) Foreign Application Priority Data
Oct. 22, 2010 (FR) ...................... 10 58639

(51) Int. Cl.
*H01L 31/0203* (2014.01)
*C08G 81/02* (2006.01)
*C09K 21/12* (2006.01)
*H01L 31/048* (2014.01)

(52) U.S. Cl.
CPC .......... *H01L 31/0203* (2013.01); *C08G 81/028* (2013.01); *C09K 21/12* (2013.01); *H01L 31/0481* (2013.01); *Y02E 10/50* (2013.01)

(58) Field of Classification Search
CPC ..................... H01L 31/0203; H01L 31/0481
See application file for complete search history.

(56) References Cited

U.S. PATENT DOCUMENTS

| 3,963,799 | A | 6/1976 | Starkweather, Jr. |
| 3,976,720 | A | 8/1976 | Hammer et al. |

(Continued)

FOREIGN PATENT DOCUMENTS

| EP | 0 245 207 A2 | 11/1987 |
| FR | 2 291 225 A1 | 6/1976 |

(Continued)

OTHER PUBLICATIONS

International Search Report (PCT/ISA/210) Issued on Dec. 23, 2011, by the French Patent Office as the International Searching Authority for International Application No. PCT/FR2011/052430.

(Continued)

*Primary Examiner* — Ling Choi
*Assistant Examiner* — Catherine S Branch
(74) *Attorney, Agent, or Firm* — Buchanan Ingersoll & Rooney P.C.

(57) ABSTRACT

A transparent, fireproof thermoplastic composition which is free from halogen compounds and includes a polyamide-block graft copolymer formed by a polyolefin backbone and, on average, at least one polyamide graft. The grafts are attached to the backbone by the radicals of an unsaturated monomer (X) that has a function capable of reacting with a polyamide, and the radicals of the unsaturated monomer (X) are attached to the backbone by grafting or co-polymerisation from the double bond thereof. The composition includes, as a weight percentage of the total composition: 90 to 99 wt % of the polyamide-block graft copolymer, and 1 to 10 wt % of metal salts of phosphoric acid.

11 Claims, 2 Drawing Sheets (a)

(b)

(c)

(56) References Cited

U.S. PATENT DOCUMENTS

| | | |
|---|---|---|
| 4,972,011 A | 11/1990 | Richardson et al. |
| 5,342,886 A | 8/1994 | Glotin et al. |
| 8,841,542 B2 | 9/2014 | Gerard et al. |
| 8,878,054 B2 | 11/2014 | Bizet et al. |
| 2006/0138391 A1 | 6/2006 | Drewes et al. |
| 2010/0099817 A1 | 4/2010 | Bizet et al. |
| 2011/0091707 A1 | 4/2011 | Jousset et al. |
| 2011/0315199 A1 | 12/2011 | Vogt et al. |
| 2012/0301991 A1 | 11/2012 | Devisme et al. |

FOREIGN PATENT DOCUMENTS

| | | |
|---|---|---|
| FR | 2 912 150 A1 | 8/2008 |
| FR | 2 930 556 A1 | 10/2009 |
| GB | 1 531 976 A | 11/1978 |
| WO | WO 99/04971 A2 | 2/1999 |

OTHER PUBLICATIONS

Jean-Jeacques Flat, "New comb-like nanostructured copolymers: A promising route towards new industrial applications," Polymer Degradation and Stability, (Dec. 2007), vol. 92, Issue 12, Elsevier Ltd., Serquigny, France, pp. 2278-2286.

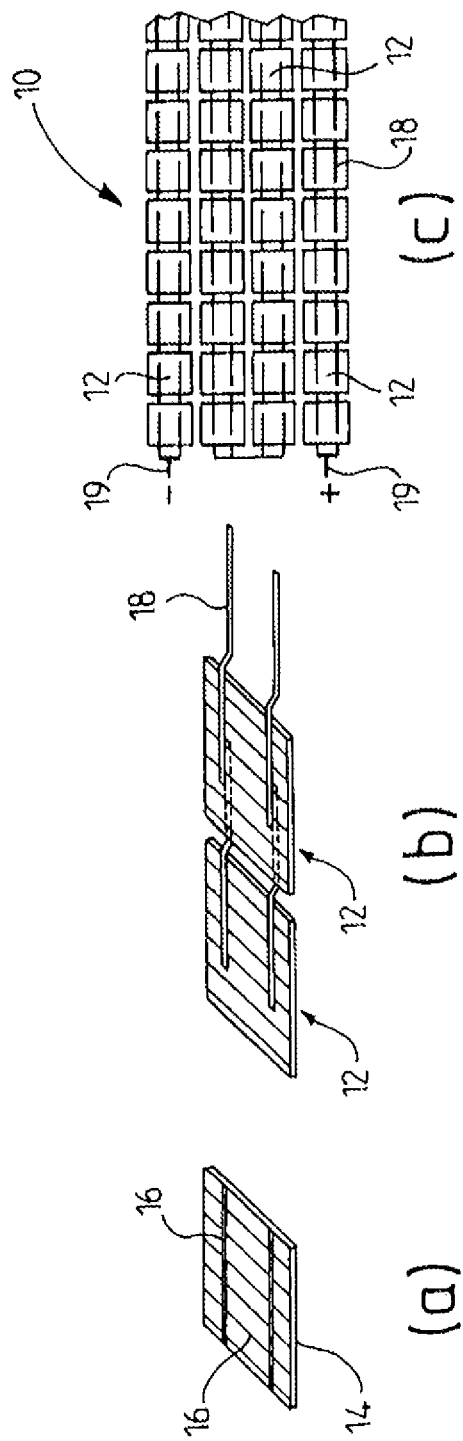
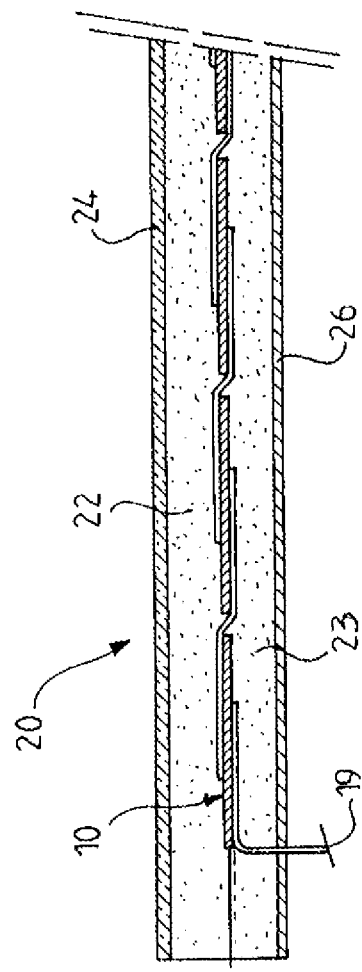

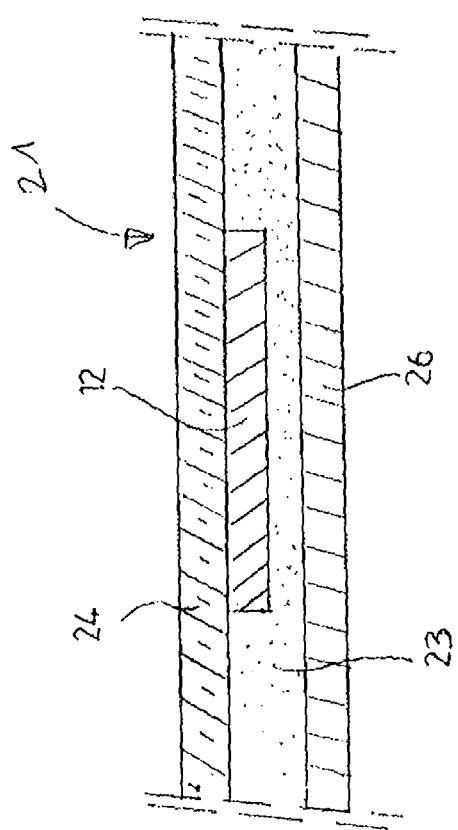

HALOGEN-FREE, FIREPROOF, TRANSPARENT THERMOPLASTIC COMPOSITIONS HAVING HIGH THERMOMECHANICAL STRENGTH, IN PARTICULAR FOR ENCAPSULATION IN PHOTOVOLTAIC MODULES

FIELD OF THE INVENTION

The invention relates to flame-retardant transparent thermoplastic compositions having high mechanical and thermomechanical strength, based on functionalized polyolefins grafted by polyamide units containing at least metal salts of phosphonic acid, and containing no halogenated compounds, nor phosphorus-containing plasticizer or red phosphorus. The present invention also relates to the use of this composition in an encapsulant or encapsulant-backsheet of a photovoltaic module and also to the photovoltaic module comprising such an encapsulant.

Global warming, linked to the greenhouse gases released by fossil fuels, has led to the development of alternative energy solutions which do not emit such gases during their operation, such as for example photovoltaic modules. A photovoltaic module comprises a "photovoltaic cell", this cell being capable of converting light energy into electricity.

There are many types of photovoltaic panel structures.

In FIG. 1, a conventional photovoltaic cell has been represented; this photovoltaic cell 10 comprises cells 12, one cell containing a photovoltaic sensor 14, generally based on silicon that is treated in order to obtain photoelectric properties, in contact with electron collectors 16 placed above (upper collectors) and below (lower collectors) the photovoltaic sensor. The upper collectors 16 of one cell are connected to the lower collectors 16 of another cell 12 by conducting bars 18, generally consisting of an alloy of metals. All these cells 12 are connected to one another, in series and/or in parallel, in order to form the photovoltaic cell 10. When the photovoltaic cell 10 is placed under a light source, it delivers a continuous electric current, which may be recovered at the terminals 19 of the cell 10.

With reference to FIG. 2, the photovoltaic module 20 comprises the photovoltaic cell 10 from FIG. 1 encased in an "encapsulant", the latter being composed of an upper portion 22 and a lower portion 23. An upper protective layer 24 (known under the term "frontsheet", used hereinafter) and a protective layer on the back of the module (known under the term "backsheet", also used hereinafter) 26 are positioned on either side of the encapsulated cell.

The impact and moisture protection of the photovoltaic cell 10 is provided by the upper protective layer 24, generally made of glass.

The backsheet 26, for example a multilayer film based on a fluoropolymer and polyethylene terephthalate, contributes to the moisture protection of the photovoltaic module 20 and to the electrical insulation of the cells 12 to prevent any contact with the outside environment.

The encapsulant 22 and 23 must perfectly adopt the shape of the space existing between the photovoltaic cell 10 and the protective layers 24 and 26 in order to avoid the presence of air, which would limit the efficiency of the photovoltaic module. The encapsulant 22 and 23 must also prevent contact of the cells 12 with water and oxygen from the air, in order to limit the corrosion thereof. The upper portion 22 of the encapsulant is between the cell 10 and the upper protective layer 24. The lower portion 23 of the encapsulant is between the cell 10 and the backsheet 26. In one embodiment variant of the encapsulant, there is no lower portion or upper portion so that the cells 12 of the cell are in contact respectively with the backsheet 26 or the frontsheet 24. This variant is illustrated in FIG. 3 where the photovoltaic cell 12 is seen in direct contact with the frontsheet 24 and is described in greater detail in particular in application WO 99/04971.

In the presence of solar radiation, a temperature rise is created inside the solar module and temperatures of 70° C. (or more) may be achieved. The thermomechanical properties, and in particular the creep resistance of the adhesive, of the binder or of the encapsulant must therefore be maintained at these temperatures so that the solar module is not deformed. The creep resistance is more particularly important in the case of the encapsulant: indeed, in the event of creep, the cell may come back into contact with air and/or the upper and/or lower protective layers, which leads to a reduction in the efficiency of the solar module, or even a degradation of the cell and of the solar module.

In order to guarantee a good durability of the solar module, the encapsulant, like the protective layers, must have a good stability in the presence of moisture and sufficient barrier properties with respect to moisture.

Furthermore, so as not to reduce the efficiency of the solar module, it is necessary for the encapsulant to enable the transmission of the light waves of the solar radiation to the cells. Again so as not to reduce the efficiency, it is necessary for these light waves to be barely diffracted, that is to say that the encapsulant must be, to the naked eye, transparent or slightly translucent, the transparency being quantified by its "haze", which must be low. It is also necessary for the encapsulant to have good electrical insulation properties, in order to avoid any short-circuit within the photovoltaic module.

Thus, in the encapsulant or encapsulant-backsheet applications for photovoltaic modules, the materials or compositions must imperatively have a perfect transparency in order to allow the lossless transmission (or transmission with minimal loss) of the light radiation. Furthermore, this thermoplastic composition/material must have a good mechanical strength, in particular with respect to the elongation at break and tensile strength properties, and also good thermomechanical properties, in particular with respect to the hot creep test, considering the temperature rise of the photovoltaic module during prolonged exposure to the sun. Finally, this thermoplastic composition/material must also have a good level of fire resistance (flame-retardancy) in the case of building-integrated photovoltaic modules.

Currently, there are no thermoplastic compositions on the market, in particular for the encapsulants of photovoltaic modules, that have satisfactory properties with regard to these various requirements that are firstly the transparency (with a need to remain transparent over time), then a good mechanical and thermomechanical strength and also a good fire resistance.

PRIOR ART

Generally, a person skilled in the art knows that the improvement of the flame-retardant properties of a thermoplastic composition generally takes place at the expense of its mechanical and thermomechanical properties. Furthermore, in the field of thermoplastic compositions/materials, it is known and practiced to add to said compositions/materials flame-retardant mineral fillers (aluminum trihydroxide, magnesium dihydroxide, ammonium polyphosphate, melamine cyanurate, metal salts of phosphinic acid, red phosphorus, brominated additives, etc.), but these additions inevitably lead to an opaque appearance.

To date, only transparent thermoplastic compositions are known provided plasticizers (which are liquid or solid at ambient temperature) are used, for example plasticizers based on phosphate groups or chlorinated/brominated groups. However, these plasticizers, which are low molecular weight species, are known to give, eventually or under thermal aging conditions, problems of surface migration ("blooming" phenomenon) and of volatility, therefore losses of usage performance over time, both from a viewpoint of the mechanical/thermomechanical performances and from a viewpoint of the transmission of light.

Document U.S. Pat. No. 4,972,011 is thus known, which describes a halogen-free flame-retardant thermoplastic composition consisting of polyamide (or of block copolymers of polyether-block-amide (PEBA) type) comprising phosphonic acid salts. Document US 2006/0138391 is also known, which describes a halogen-free flame-retardant thermoplastic composition consisting of an optionally impact-modified polyamide (blends of polyamide and of functional rubbers) comprising phosphonic acid salts and nitrogen-containing additives.

These compositions are not presented as transparent and even if a particular thermoplastic variety described in these documents is so, it is known that impact-modified PAs give opaque materials insofar as the dispersion of the functional rubber nodules has sizes that are always greater than 100 nm, inevitably leading to the diffraction of the light rays and therefore to opaque materials. Furthermore, their mechanical and thermomechanical qualities are particularly low and certainly are not sufficient for high tech and long service life applications, such as certain applications for photovoltaic modules.

BRIEF DESCRIPTION OF THE INVENTION

It has been observed by the applicant, after various experiments and manipulations, that a halogen-free thermoplastic composition fulfills all of the properties necessary in particular for high tech applications in the photovoltaic field, namely an optimum degree of transparency and a retention of these optical properties over time including when confronted with harsh environmental conditions, and excellent mechanical and thermomechanical properties and also the classification of this composition as a flame-retardant material according to the UL94 classification.

Thus, the present invention relates to a flame-retardant and transparent thermoplastic composition that contains no halogenated compound, comprising a polyamide-block graft copolymer consisting of a polyolefin backbone and, on average, at least one polyamide graft wherein the grafts are attached to the backbone by the residues of an unsaturated monomer (X) having a function capable of reacting with a polyamide, the residues of the unsaturated monomer (X) are attached to the backbone by grafting or copolymerization via its double bond, characterized in that the composition comprises, as a weight percentage of the total composition:
  between 90% and 99% by weight of the polyamide-block graft copolymer, and
  between 1% and 10% by weight of metal salts of phosphonic acid.
Advantageously, the thermoplastic composition of the invention comprises:
  between 94% and 97% by weight of the polyamide-block graft copolymer, and
  between 3% and 6% by weight of metal salts of phosphonic acid.

According to one distinctive feature of the invention, the polyamide-block graft copolymer comprises from 10% to 50% by weight of polyamide grafts.

According to one distinctive feature of the invention, the molar mass of the polyamide grafts is within the range extending from 1000 to 5000 g/mol, preferably within the range extending from 2000 to 3000 g·mol$^{-1}$. Furthermore, the number of monomers (X) attached to the polyolefin backbone is greater than or equal to 1.3 and/or less than or equal to 10.

According to one preferred embodiment of the invention, the unsaturated monomer (X) is chosen from a carboxylic acid anhydride and an unsaturated epoxide.

According to one embodiment of the invention, the thermoplastic composition comprises only the polyamide-block graft copolymer and a metal salt of phosphonic acid.

According to one variant, the thermoplastic composition of the invention comprises at least one coupling agent in order to improve the adhesive strength of the composition to the substrates of the photovoltaic cell when this adhesive strength must be particularly high.

The composition may also comprise at least one of the additional components chosen from crosslinking agents, UV absorbers, mineral fillers, plasticizers, and coloring or whitening compounds.

The present invention also relates to the use of this thermoplastic composition as an encapsulant film for a photovoltaic module.

Finally, the invention also relates to a photovoltaic module having at least two films, including one film that forms an encapsulant, comprising a photovoltaic cell capable of generating electrical energy, this film being formed by the aforesaid thermoplastic composition.

DESCRIPTION OF THE APPENDED FIGURES

The description which follows is given solely by way of illustration and nonlimitingly with reference to the appended figures, in which:

FIG. 1, already described, represents an example of a photovoltaic cell, the parts (a) and (b) being ¾ views, part (a) showing a cell before connection and part (b) a view after connection of two cells; part (c) is a top view of a complete photovoltaic cell.

FIG. 2, already described, represents a cross section of a photovoltaic module, the "conventional" photovoltaic sensor of which is encapsulated by an upper encapsulant film and a lower encapsulant film.

FIG. 3, already described, represents a cross section of a photovoltaic module, the "thin-film" photovoltaic sensor of which, deposited on the upper protective layer, is encapsulated with a lower encapsulant film.

DETAILED DESCRIPTION OF THE INVENTION

Regarding the polyolefin backbone, this is a polymer comprising, as monomer, an α-olefin.

α-olefins having from 2 to 30 carbon atoms are preferred.

As α-olefin, mention may be made of ethylene, propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, 1-hexacosene, 1-octacosene, and 1-triacontene. In the context of the present invention, the term "α-olefin" also comprises styrene. Propylene, and very especially ethylene, are preferred as α-olefin.

This polyolefin may be a homopolymer when a single α-olefin is polymerized in the polymer chain. Mention may be made, as examples, of polyethylene (PE) or polypropylene (PP).

This polyolefin may also be a copolymer when at least two comonomers are copolymerized in the polymer chain, one of the two comonomers referred to as the "first comonomer" being an α-olefin and the other comonomer, referred to as the "second comonomer" is a monomer capable of polymerizing with the first monomer.

As the second comonomer, mention may be made of:
one of the α-olefins already mentioned, the latter being different from the first α-olefin comonomer,
dienes, such as for example 1,4-hexadiene, ethylidene norbornene and butadiene,
unsaturated carboxylic acid esters such as, for example, alkyl acrylates or alkyl methacrylates grouped together under the term alkyl(meth)acrylates. The alkyl chains of these (meth)acrylates may have up to 30 carbon atoms. Mention may be made, as alkyl chains, of methyl, ethyl, propyl, n-butyl, sec-butyl, isobutyl, tert-butyl, pentyl, hexyl, heptyl, octyl, 2-ethylhexyl, nonyl, decyl, undecyl, dodecyl, tridecyl, tetradecyl, pentadecyl, hexadecyl, heptadecyl, octadecyl, nonadecyl, eicosyl, heneicosyl, docosyl, tricosyl, tetracosyl, pentacosyl, hexacosyl, heptacosyl, octacosyl, nonacosyl. Methyl, ethyl and butyl (meth)acrylates are preferred as unsaturated carboxylic acid esters,
carboxylic acid vinyl esters. As examples of carboxylic acid vinyl esters, mention may be made of vinyl acetate, vinyl versatate, vinyl propionate, vinyl butyrate or vinyl maleate. Vinyl acetate is preferred as carboxylic acid vinyl ester.

Advantageously, the polyolefin backbone comprises at least 50 mol % of the first comonomer; its density may advantageously be between 0.86 and 0.96.

The preferred polyolefin backbones consist of an ethylene/alkyl (meth)acrylate copolymer. By using this polyolefin backbone, excellent aging, light and temperature resistance are obtained.

It would not be outside of the scope of the invention if different "second comonomers" were copolymerized in the polyolefin backbone.

According to the present invention, the polyolefin backbone contains at least one residue of a functional unsaturated monomer (X) that can react at an acid and/or amine function of the polyamide graft via a condensation reaction. According to the definition of the invention, the functional unsaturated monomer (X) is not a "second comonomer".

As functional unsaturated monomer (X) included in the polyolefin backbone, mention may be made of:
unsaturated epoxides. Among these, are for example aliphatic glycidyl esters and ethers such as allyl glycidyl ether, vinyl glycidyl ether, glycidyl maleate and glycidyl itaconate, glycidyl acrylate and glycidyl methacryalte. They are also, for example, alicyclic glycidyl esters and ethers such as 2-cyclohexene-1-glycidyl ether, glycidyl cyclohexene-4,5-dicarboxylate, glycidyl cyclohexene-4-carboxylate, glycidyl 5-norbornene-2-methyl-2-carboxylate and diglycidyl endo-cis-bicyclo[2.2.1]-5-heptene-2,3-dicarboxylate. As unsaturated epoxide, glycidyl methacrylate is preferably used.
Unsaturated carboxylic acids and their salts, for example acrylic acid or methacrylic acid and the salts of the same acids.
Carboxylic acid anhydrides. They may be chosen, for example, from maleic, itaconic, citraconic, allylsuccinic, cyclohex-4-ene-1,2-dicarboxylic, 4-methylenecyclohex-4-ene-1,2-dicarboxylic, bicyclo[2.2.1]hept-5-ene-2,3-dicarboxylic and x-methyl-bicyclo[2.2.1]hept-5-ene-2,2-dicarboxylic anhydrides. As carboxylic acid anhydride, maleic anhydride is preferably used.

The functional unsaturated monomer (X) is preferably chosen from an unsaturated carboxylic acid anhydride and an unsaturated epoxide. In particular, for achieving the condensation of the polyamide graft with the polyolefin backbone, in the case where the reactive end of the polyamide graft is a carboxylic acid function, the functional unsaturated monomer (X) is preferably an unsaturated epoxide. In the case where the reactive end of the polyamide graft is an amine function, the functional unsaturated monomer (X) is preferably an unsaturated carboxylic acid anhydride.

According to one advantageous version of the invention, the preferred number of functional unsaturated monomers (X) attached, on average, to the polyolefin backbone is greater than or equal to 1.3 and/or preferably less than or equal to 10.

When (X) is maleic anhydride and the number-average molar mass of the polyolefin is 15 000 g/mol, it was found that this corresponded to an anhydride proportion of at least 0.8%, and at most 6.5%, by weight of the whole of the polyolefin backbone. These values associated with the mass of the polyamide grafts determine the proportion of polyamide and of backbone in the polyamide graft polymer.

The polyolefin backbone containing the residue of the functional unsaturated monomer (X) is obtained by polymerization of the monomers (first comonomer, optional second comonomer, and optionally functional unsaturated monomer (X)). This polymerization can be carried out by a high-pressure radical process or a process in solution, in an autoclave or tubular reactor, these processes and reactors being well known to a person skilled in the art. When the functional unsaturated monomer (X) is not copolymerized in the polyolefin backbone, it is grafted to the polyolefin backbone. The grafting is also an operation that is known per se. The composition would be in accordance with the invention if several different functional monomers (X) were copolymerized with and/or grafted to the polyolefin backbone.

Depending on the types and ratio of monomers, the polyolefin backbone may be semicrystalline or amorphous. In the case of amorphous polyolefins, only the glass transition temperature is observed, whereas in the case of semicrystalline polyolefins a glass transition temperature and a melting temperature (which will inevitably be higher) are observed. A person skilled in the art will only have to select the ratios of monomer and the molecular masses of the polyolefin backbone in order to be able to easily obtain the desired values of the glass transition temperature, optionally of the melting temperature, and also of the viscosity of the polyolefin backbone.

Preferably, the polyolefin has a melt flow index (MFI) between 3 and 400 g/10 min (190° C./2.16 kg, ASTM D 1238).

The polyamide grafts may be either homopolyamides or copolyamides.

The expression "polyamide grafts" especially targets the aliphatic homopolyamides which result from the polycondensation:
of a lactam;
or of an aliphatic α,ω-aminocarboxylic acid;
or of an aliphatic diamine and an aliphatic diacid.

As examples of a lactam, mention may be made of caprolactam, oenantholactam and lauryllactam.

As examples of an aliphatic α,ω-aminocarboxylic acid, mention may be made of aminocaproic acid, 7-aminoheptanoic acid, 11-aminoundecanoic acid and 12-aminododecanoic acid. As examples of an aliphatic diamine, mention may be made of hexamethylenediamine, dodecamethylenediamine and trimethylhexamethylene-diamine.

As examples of an aliphatic diacid, mention may be made of adipic, azelaic, suberic, sebacic and dodecanedicarboxylic acids.

Among the aliphatic homopolyamides, mention may be made, by way of example and nonlimitingly, of the following polyamides: polycaprolactam (PA-6); polyundecanamide (PA-11, sold by Arkema under the brand Rilsan®); polylauryllactam (PA-12, also sold by Arkema under the brand Rilsan®); polybutylene adipamide (PA-4,6); polyhexamethylene adipamide (PA-6,6); polyhexamethylene azelamide (PA-6,9); polyhexamethylene sebacamide (PA-6,10); polyhexamethylene dodecanamide (PA-6,12); polydecamethylene dodecanamide (PA-10,12); polydecamethylene sebacamide (PA-10,10) and polydodecamethylene dodecanamide (PA-12,12).

The expression "semicrystalline polyamides" also targets cycloaliphatic homopolyamides.

Mention may especially be made of the cycloaliphatic homopolyamides which result from the condensation of a cycloaliphatic diamine and an aliphatic diacid.

As an example of a cycloaliphatic diamine, mention may be made of 4,4'-methylenebis(cyclohexylamine), also known as para-bis(aminocyclohexyl)methane or PACM, 2,2'-dimethyl-4,4'-methylenebis(cyclohexylamine), also known as bis(3-methyl-4-aminocyclohexyl)-methane or BMACM.

Thus, among the cycloaliphatic homopolyamides, mention may be made of the polyamides PACM,12 that results from the condensation of PACM with the C12 diacid, BMACM,10 and BMACM,12 that result from the condensation of BMACM with, respectively, C10 and C12 aliphatic diacids.

The expression "polyamide grafts" also targets the semi-aromatic homopolyamides that result from the condensation:
 of an aliphatic diamine and an aromatic diacid, such as terephthalic acid (T) and isophthalic acid (I). The polyamides obtained are then commonly known as "polyphthalamides" or PPAs; and
 of an aromatic diamine, such as xylylenediamine, and more particularly meta-xylylenediamine (MXD) and an aliphatic diacid.

Thus, nonlimitingly, mention may be made of the polyamides 6,T, 6,I, MXD,6 or else MXD,10.

The polyamide grafts used in the composition according to the invention are preferably copolyamides. These result from the polycondensation of at least two of the groups of monomers mentioned above in order to obtain homopolyamides. The term "monomer" in the present description of the copolyamides should be taken in the sense of a "repeat unit". This is because the case where a repeat unit of the PA is formed from the combination of a diacid with a diamine is particular. It is considered that it is the combination of a diamine and a diacid, that is to say the diamine-diacid pair (in an equimolar amount), which corresponds to the monomer. This is explained by the fact that individually, the diacid or the diamine is only one structural unit, which is not enough on its own to polymerize in order to give a polyamide.

Thus, the copolyamides cover especially the condensation products of:
 at least two lactams;
 at least two aliphatic α,ω-aminocarboxylic acids;
 at least one lactam and at least one aliphatic α,ω-aminocarboxylic acid;
 at least two diamines and at least two diacids;
 at least one lactam with at least one diamine and at least one diacid;
 at least one aliphatic α,ω-aminocarboxylic acid with at least one diamine and at least one diacid,
the diamine(s) and the diacid(s) possibly being, independently of one another, aliphatic, cycloaliphatic or aromatic.

Depending on the types and ratio of monomers, the copolyamides may be semicrystalline or amorphous. In the case of amorphous copolyamides, only the glass transition temperature is observed, whereas in the case of semicrystalline copolyamides a glass transition temperature and a melting temperature (which will inevitably be higher) are observed.

Among the amorphous copolyamides that can be used within the context of the invention, mention may be made, for example, of the copolyamides containing semiaromatic monomers.

Among the copolyamides, it is also possible to use semicrystalline copolyamides and particularly those of the PA-6/11, PA-6/12 and PA-6/11/12 type.

The degree of polymerization may vary to a large extent; depending on its value it is a polyamide or a polyamide oligomer.

Advantageously, the polyamide grafts are monofunctional.

So that the polyamide graft has a monoamine end group, it is sufficient to use a chain limiter of formula:

in which:
 $R_1$ is hydrogen or a linear or branched alkyl group containing up to 20 carbon atoms; and
 $R_2$ is a group having up to 20 carbon atoms that is a linear or branched alkyl or alkenyl group, a saturated or unsaturated cycloaliphatic radical, an aromatic radical or a combination of the preceding. The limiter may be, for example, butylamine, hexylamine, heptylamine, octylamine, decylamine, laurylamine or oleylamine.

So that the polyamide graft has a carboxylic monoacid end group, it is sufficient to use a chain limiter of formula R'1-COOH, R'1-CO-O-CO-R'2 or a carboxylic diacid.

R'1 and R'2 are linear or branched alkyl groups containing up to 20 carbon atoms.

Advantageously, the polyamide graft has one end group having an amine functionality. The preferred monofunctional polymerization limiters are laurylamine and oleylamine.

Advantageously, the polyamide grafts have a molar mass between 1000 and 5000 g/mol and preferably between 2000 and 3000 g/mol.

The polycondensation defined above is carried out according to commonly known processes, for example at a temperature generally between 200° C. and 350° C., under vacuum or in an inert atmosphere, with stirring of the reaction mixture. The average chain length of the graft is determined by the initial molar ratio between the polycondensable monomer or the lactam and the monofunctional polymerization limiter. For the calculation of the average chain length, one chain limiter molecule is usually counted per one graft chain.

A person skilled in the art will only have to select the types and ratio of monomers and also choose the molar masses of the polyamide grafts in order to be able to easily obtain the desired values of the glass transition temperature, optionally of the melting temperature and also of the viscosity of the polyamide graft.

The condensation reaction of the polyamide graft on the polyolefin backbone containing the residue of (X) is carried out by reaction of one amine or acid function of the polyamide graft with the residue of (X). Advantageously, monoamine polyamide grafts are used and amide or imide bonds are created by reacting the amine function with the function of the residue of (X).

This condensation is preferably carried out in the melt state. To manufacture the composition according to the invention, it is possible to use conventional kneading and/or extrusion techniques. The components of the composition are thus blended to form a compound which may optionally be granulated on exiting the die.

To obtain the graft copolymers of the invention, it is thus possible to blend the polyamide graft and the backbone in an extruder, for example a self-cleaning meshing co-rotating twin-screw extruder, at a temperature generally between 150° C. and 300° C. The average residence time of the molten material in the extruder may be between 5 seconds and 5 minutes, and preferably between 20 seconds and 1 minute. The efficiency of this condensation reaction is evaluated by selective extraction of free polyamide grafts, that is to say those that have not reacted to form the polyamide graft polymer.

The preparation of polyamide grafts having an amine end group and also their addition to a polyolefin backbone containing the residue of (X) is described in patents U.S. Pat. No. 3,976,720, U.S. Pat. No. 3,963,799, U.S. Pat. No. 5,342,886 and FR 2291225.

The polyamide graft polymer of the present invention advantageously has a nanostructured organization. To obtain this type of organization, use will preferably be made, for example, of grafts having a number-average molar mass $M_n$ between 1000 and 5000 g/mol and more preferably between 2000 and 3000 g/mol. Use will also preferably be made of between 10% and 50% by weight of polyamide grafts and a number of monomers (X) between 1.3 to 10.

Advantageously, the flow temperature of the polyamide graft polymer is less than or equal to 160° C., which permits a processing temperature that is particularly well suited to the current techniques for manufacturing solar panels.

Regarding the metal salts of phosphonic acid, these may be any salts from among the metal salts of alkyl alkylphosphonic acid of general formula (I):

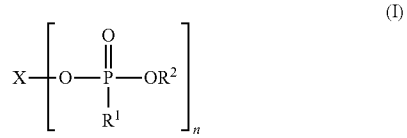

(I)

Where X is a metal atom and $R^1$ and $R^2$ are the same or different linear or branched alkyl groups possessing from 1 to 12 carbon atoms, preferably from 1 to 4 carbon atoms, such as the examples below given nonlimitingly: methyl, ethyl, propyl, isopropyl, butyl, isobutyl, sec-butyl; n being equal to the valence number of the metal X, which lies between 1 and 4, preferably between 2 and 3. Hereinafter, relative to the test examples, use is made of methyl methylphosphonic acid, but it is clearly understood that a similar result would be obtained with any metal salts of alkyl alkylphosphonic acid, according to the specifications set out above.

The metals X of the above formula capable of being present in the metal salts of alkyl alkylphosphonic acid comprise alkaline metals or transition metals such as the group below given nonlimitingly: Ca (calcium), Mg (magnesium), Zn (zinc), Al (aluminum), Fe (iron), Ni (nickel), Cr (chromium) and Ti (titanium).

Preferably, the metal salt of phosphonic acid is the aluminum salt of methyl methylphosphonic acid (AMMP), where X is the aluminum atom, $R^1$ and $R^2$ are methyl groups and n is equal to 3. AMMP contains a high degree of active phosphorus (26% by weight). AMMP can be synthesized either by reacting methyl methylphosphonate with an aqueous solution of sodium hydroxide then by precipitating it with aluminum chloride, or by the direct reaction of aluminum hydroxide with methyl methylphosphonate at 180° C. under vigorous stirring.

Preferably, the metal salt of alkyl alkylphosphonic acid is in the form of a powder with particles sizes of less than 25 μm (micrometer), more preferably of less than 10 μm and more preferably still less than 5 μm. The preferred form of the metal salt of alkyl alkylphosphonic acid comprises a distribution of particles between 0.1 and 3 μm, without the presence of particles having a size of less than 0.1 μm.

Fillers, in particular mineral fillers, may be added in order to improve the thermomechanical strength of the composition. Given nonlimitingly as examples are silica, alumina or calcium carbonates or carbon nanotubes. Advantageously, use will be made of nanoscale fillers (organophilic clays or carbon nanotubes) which are dispersed on the nanometer scale; this makes it possible to retain, in the best cases, the transparency of the materials.

It is also possible to add coloring or whitening compounds.

Regarding the aspects of the invention relating to the use of the thermoplastic composition in a photovoltaic module, a person skilled in the art may refer, for example, to the Handbook of Photovoltaic Science and Engineering, Wiley, 2003. Indeed, the composition of the invention may be used as an encapsulant or encapsulant-backsheet in a photovoltaic module, the structure of which is described in relation to the appended figures.

Among the list of additives below, a person skilled in the art will easily know how to select their amounts in order to obtain the desired properties of the composition, in particular in its application in photovoltaic modules.

Coupling agents, although not necessary, may advantageously be added in order to improve the adhesive strength of the composition on the substrates of the photovoltaic cell when this adhesive strength must be particularly high. The coupling agent is a non-polymeric ingredient; it may be organic, crystalline, mineral and more preferably semi-mineral semi-organic. Among the latter, mention may be made of organic titanates or silanes, such as for example monoalkyl titanates, trichlorosilanes and trialkoxysilanes.

Although crosslinking is not obligatory, it is possible for further improving the thermomechanical properties of the encapsulant, in particular when the temperature becomes very high. It is not therefore outside the scope of the invention if crosslinking agents are added. Mention may be made, by way of example, of organic peroxides. This crosslinking may also be carried out by known irradiation techniques.

Preferably, the composition comprises no more than 10% tackifying resin and preferably does not contain any. Indeed, when these resins are added to the polyamide graft polymer, the transparency of the composition and the creep resistance decrease. These tackifying resins are, for example, rosins and derivatives thereof, polyterpenes and derivatives thereof. Surprisingly, no tackifying resin is necessary for giving the composition properties of adhesion to the various supports of solar modules.

In this particular application of the composition in photovoltaic modules, since the UV radiation is capable of resulting in a slight yellowing of the composition used as an encapsulant for said modules, UV stabilizers may be added in order to ensure the permanence/longevity of the transparency of the encapsulant during its service life. These compounds may be, for example, based on benzophenone or benzotriazole. They can be added in amounts of less than 10%, and preferably of from 0.1% to 5%, by weight of the total weight of the composition.

Obtaining the Formulations Tested:

The formulations described below are prepared by compounding using, for example, a Coperion® ZSK30 self-cleaning meshing co-rotating twin-screw extruder having a diameter of 30 millimeters (mm), a length 44 times its diameter (i.e. 132 centimeters) with a flat profile at 200° C., with a throughput of 20 kg/h (kilograms per hour) and a rotational speed of 300 rpm (revolutions per minute), the polymers and the additives in powder form being introduced as main feed.

Generally, the term "compounding" is understood to mean a technique for obtaining polymers or blends of polymers that is well known to a person skilled in the art and which consists of a shaping of the formulate (present for example in the form of rods on leaving the kneader) by extrusion through a die having circular holes, then cutting of the cooled rods and drying in order to manufacture granules that are a few millimeters in diameter and in length.

Materials Used for Forming the Formulations Tested:

Apolhya®: graft copolymer with a backbone composed of a terpolymer of ethylene, ethyl acrylate (EA) and maleic anhydride (MAh) possessing 17% of EA, 3% of MAh and an MFI (190° C., 2.16 kg) of 70 and possessing 12/6 (60/40) monoamine copolyamide grafts having an Mn of 2500 g/mol.

AF069: aluminum salt of methyl methylphosphonic acid, sold by ICL.

Exolit® AP766: ammonium polyphosphate produced by Clariant and having a phosphorus content of 21% and a nitrogen content of 12%.

Siliporite® NK10AP: molecular sieve of zeolite 4A type produced by CECA.

Lotader®: terpolymer of ethylene, ethyl acrylate (EA) and maleic anhydride (MAh) having 17% of EA, 3% of MAh and an MFI (190° C., 2.16 kg) of 70.

Domamid® 24: PA-6 sold by DOMO, having a relative viscosity of 2.4 measured at 1% in 96% sulfuric acid according to the standard ISO 307.

Melapur® C25: melamine cyanurate sold by CIBA-BASF.

The present invention is illustrated in greater detail by the following nonlimiting examples.

EXAMPLE 1 the composition entitled "DM1" is a formulation that comes under the scope of the present invention. It comprises, as a weight percentage of the total composition, 90.8% of Apolhya® and 9.2% of AF069.

EXAMPLE 2 the composition entitled "DM2" is a formulation that comes under the scope of the present invention. It comprises, as a weight percentage of the total composition, 98.5% of Apolhya® and 1.5% of AF069.

EXAMPLE 3 the composition entitled "DM3" is a formulation that comes under the scope of the present invention. It comprises, as a weight percentage of the total composition, 96% of Apolhya® and 4% of AF069.

EXAMPLE 4 the composition entitled "DM4" is a formulation that comes under the scope of the present invention. It comprises, as a weight percentage of the total composition, 94.3% of Apolhya® and 5.7% of AF069.

EXAMPLE 5 the composition entitled "DM5" is a formulation that comes under the scope of the present invention. It comprises, as a weight percentage of the total composition, 96.6% of Apolhya® and 3.4% of AF069.

In order to compare the examples of the invention with respect to thermoplastic compositions from the prior art, the following examples of compositions were proposed for the tests.

EXAMPLE 6 the composition entitled "DM6" is a formulation comprising, as a weight percentage of the thermoplastic composition, 100% of Apolhya®.

EXAMPLE 7 the composition entitled "DM7" is a formulation comprising, as a weight percentage of the thermoplastic composition, 78% of Apolhya®, 20% of Exolit® AP766 and 2% of Siliporite® NK10AP.

EXAMPLE 8 the composition entitled "DM8" is a formulation comprising, as a weight percentage of the thermoplastic composition, 86% of Apolhya® and 14% of AF069.

EXAMPLE 9 the composition entitled "DM9" is a formulation comprising, as a weight percentage of the thermoplastic composition, 99.6% of Apolhya® and 0.4% of AF069.

EXAMPLE 10 the composition entitled "DM10" is a formulation comprising, as a weight percentage of the thermoplastic composition, 6% of AF069, 10% of Melapur MC25, 59% of Lotader and 25% of Domamid 24.

Tests Carried Out on the Test Specimens:

The granules resulting from the synthesis processes are shaped using a laboratory twin-screw extruder of Thermo-Haake Rheocord System 40 type equipped with a sheet die; the extruder being heated at 210° C. in order to give strips, from which the test specimens necessary in order to characterize the materials will be cut, with a punch.

The tests that make it possible to characterize the mechanical properties of a standard test specimen of a thermoplastic composition consist, as representatively as possible, in carrying out a tensile test according to the standard ISO R527:

93-1BA in order to measure the elongation at break and tensile strength of these thermoplastic materials.

The value of the elongation at break defines the capacity of a material to elongate before breaking when it is stressed under tension. A material is considered to have good mechanical properties from the point of view of its ductility/brittleness when its elongation at break value is greater than 100% and when its tensile strength value is greater than 7 MPa.

The creep test in an oven (at high temperature and under a pressure greater than atmospheric pressure) for a certain duration comes next. In this particular case, this creep test of the test specimens of IFC (French Institute of Rubber) type cut from the films is carried out at 120° C. under a load of 0.5 bar for 15 minutes and consists in measuring the elongation undergone by the test specimens. If the test specimen yields under the load, the time for arriving at this failure is noted. This test is known to a person skilled in the art under the name "hot set test".

The resistance to flame propagation is then measured according to the UL94 test according to the standard ISO 1210 on test specimens having a thickness of 1.6 mm (millimeter). This test consists of a double application of a standardized flame in order to determine the extinguishing times on the one hand and to verify on the other hand the generation or otherwise of flaming drips (FD) or of non-flaming drips (NFD), this test being repeated 5 times in order to consolidate the experiment. It will be noted that, in order to satisfy the VO classification according to the UL 94 flame propagation test, it is possible for non-flaming drips (NFD) to appear, but in no case for flaming drips (FD) to appear.

In the targeted application, the UL94-V2 classification is expected.

Essential tests are then carried out on the characteristics of transparency of the thermoplastic composition but also of yellowness index and of haze. All the test specimens were subjected to tests for measuring the light transmitted in the spectral region covering wavelengths between 360 nm and 830 nm and the percentage of this light transmitted was measured for each of the test specimens according to the standard ASTM D1003.

In the targeted application, a percentage of transmission of visible light, typically in a wavelength range from 400 to 800 nm, that is as high as possible and is at least 85% is expected/desired.

This test is supplemented by the measurement of the "yellowness index" which measures, after a certain time period and in a particular environment, the yellowness index of the test specimen.

In the targeted application, a yellowness index that is as low as possible, less than 5 and preferably less than 2, is expected/desired.

The haze tests consists in measuring the light transmitted through a test specimen. This transmitted light is measured using a nephelometer or a spectrophotometer. The degree of the haze is measured according to the standard ASTM D1003 with an illuminant C under 2°.

In the targeted application, a haze value that is as low as possible, less than 10 and preferably less than 5 is expected/desired.

All these tests are carried out conventionally by taking standard test specimens of identical shape for each composition tested and by making them undergo each test on a test bench, according to the definitions (shape, dimensions, test speeds, calibration of the machine, accuracy of the apparatus, etc.) given by the international standards and that are well known to a person skilled in the art.

The composition must satisfy all of the aforementioned tests in an optimal manner in order to be considered to be satisfactory from the point of view of its mechanical properties (elongation at break and tensile strength), its thermomechanical properties or in other words its creep resistance at high temperature (hot creep), its flame-retardant properties (UL94 classification) and finally with regard to its transparency. It is clearly understood that the difficulty consists in finding a composition that exhibits good performances for all of the properties tested and that a single one of these properties at a level below the requirement of the application is enough to disqualify this composition.

As can be observed, the applicant observed, after its experimentations, that, surprisingly, the composition according to the invention perfectly satisfies all of the tests demonstrating that its mechanical, thermomechanical and flame-retardant properties are excellent, or in other words of a very high level.

The compositions according to the invention therefore fulfill the criteria for being able to be very advantageously used as flame-retardant binder or encapsulant in solar modules.

Results of the Tests Carried Out on the Test Specimens of Various Formulations:

|  | DM1 | DM2 | DM3 | DM4 | DM5 | DM6 | DM7 | DM8 | DM9 | DM10 |
|---|---|---|---|---|---|---|---|---|---|---|
| APOLHYA | 90.8 | 98.5 | 96 | 94.3 | 96.6 | 100 | 78 | 86 | 99.6 |  |
| AF069 | 9.2 | 1.5 | 4 | 5.7 | 3.4 |  |  | 14 | 0.4 | 6 |
| Exolit AP776 |  |  |  |  |  |  | 20 |  |  |  |
| Siliporite NK10AP |  |  |  |  |  |  | 2 |  |  |  |
| Melapur MC25 |  |  |  |  |  |  |  |  |  | 10 |
| Lotader |  |  |  |  |  |  |  |  |  | 59 |
| Domamid 24 |  |  |  |  |  |  |  |  |  | 25 |
| TESTS | | | | | | | | | | |
| Elongation at break (%) | 290 | 420 | 439 | 380 | 430 | 436 | 252 | 300 | 410 | 42 |
| Tensile strength (MPa) | 9.8 | 12 | 11.9 | 11.6 | 12.1 | 12.3 | 6 | 9 | 11.9 | 4 |
| Hot creep (% or time) | 11% | 18% | 17% | 15% | 19% | 20% | 10% | 14% | 20% | 5 min |
| UL94 classification | V2 | V2/NC | V2 | V2 | V2 | NC* | V0 | V2 | NC* | V0 |
| Light transmission (%) | 85.2 | 86.4 | 86.1 | 85.8 | 86.2 | 86.6 | 20 | 74 | 86.4 | 15 |
| Yellowness index (%) | 3.9 | 3.3 | 3.4 | 3.4 | 3.2 | 3.2 | 6 | 8 | 3 | 9 |
| Haze (%) | 8 | 3 | 6 | 7 | 6 | 2 | 100 | 18 | 2 | 100 |

**: NC = not classified

By carrying out these first experimentations, the applicant noted that the addition of AF069 was particularly prejudicial to the transparency of an initially transparent or semi-transparent polymer. Presented below is a table of results with the polymer PC Makrolon, Rilsan G830, modified Altuglas V825T or Apolhya Solar.

| Transmittance through films (illuminant D65, angle 2°) | Apolhya LC3 | | Makrolon 2207 | | Rilsan G830 | | Altuglas V825T | |
|---|---|---|---|---|---|---|---|---|
| | Pure | +4% AF069 | Pure | +4% AF069 | Pure | +4% AF069 | Pure | +4% AF069 |
| Thickness (μm) | 600 | 550 | 60 | 60 | 50 | 90 | 160 | 130 |
| Transmittance at 560 nm | 89.9 | 87.5 (−3%) | 90.1 | 82.7 (−8%) | 91.6 | 85.3 (−7%) | 89.9 | 86.6 (−4%) |
| Yellowness index (YI) (according to ASTM E313 D65) | 1.7 | 3 (×1.7) | 0.5 | 1.6 (×3) | 0.4 | 2.4 (×6.2) | 0.9 | 2.4 (×2.6) |
| Haze (according to ASTM D1003-97 C) | 8 | 15 (×1.9) | 1 | 40 (×4) | 1 | 20 (×20) | 7 | 19 (×2.9) |

The products used for carrying out the studies and the analyses below are the following:

Apolhya ® LC3: thermoplastic based on a nanostructured copolymer having a melting temperature of 130° C. and a MFI value of 15 to 20 g/10 min according to ASTM D1238 at 190° C. under 2.16 kg, produced and sold by Arkema;

Makrolon® 2207: low-viscosity polycarbonate having an MFI value of 38 according to ASTM D1238 at 300° C. under 1.2 kg, produced and sold by Bayer;

Rilsan® G830: bio-based transparent polyamide having a glass transition temperature of 135° C., a content of renewable carbon of from 53% to 55%, produced and sold by Arkema;

Altuglas® V825T: PMMA having an MFI value of 3.8 according to ASTM D1238 under 3.8 kg at 230° C. and a Vicat softening temperature of 101° C. according to ASTM D1525, produced and sold by Altuglass.

These results show that the addition of a significant amount of AF069 (4%) considerably reduces the optical properties of the polymer materials. In particular, this is true for Makrolon 2207 and for Rilsan G830 and to a lesser extent, but also significantly, for Altuglas V825T and Apolhya LC3.

It is therefore obvious that a person skilled in the art, in regard to these first results, cannot envisage that the addition of AF069 could be conceivable for improving the properties of transparent polymer materials, without greatly impairing their transparency properties (transmittance, yellowness index and haze) and it is only after a large number of experiments that the applicant has arrived at an optimum result, in the particular range of AF069 added to the base thermoplastic composition.

The invention claimed is:

1. A flame-retardant and transparent thermoplastic composition that contains no halogenated compound, the composition comprising a polyamide-block graft copolymer consisting of a polyolefin backbone and, on average, at least one polyamide graft wherein the grafts are attached to the backbone by the residues of a functional unsaturated monomer (X) having a function capable of reacting with a polyamide, the residues of the unsaturated monomer (X) are attached to the backbone by grafting or copolymerization via its double bond, said polyamide-block graft composition presenting a nanostructured organization, the composition comprises, as a weight percentage of the total composition:

between 90% and 99% by weight of the polyamide-block graft copolymer, and
between 1% and 10% by weight of a metal salt of phosphonic acid.

2. The composition as claimed in claim 1, wherein the composition comprises:

between 94% and 97% by weight of the polyamide-block graft copolymer, and
between 3% and 6% by weight of a metal salt of alkyl alkylphosphonic acid.

3. The composition as claimed in claim 1, wherein the polyamide-block graft copolymer comprises from 10% to 50% by weight of polyamide grafts.

4. The composition as claimed in claim 1, wherein the molar mass of the polyamide grafts is within the range extending from 1000 to 5000 g/mol.

5. The composition as claimed in claim 1, wherein the number of monomers (X) attached to the polyolefin backbone is greater than or equal to 1.3 and/or less than or equal to 10.

6. The composition as claimed in claim 1, wherein the unsaturated monomer (X) is chosen from a carboxylic acid anhydride and an unsaturated epoxide.

7. The composition as claimed in claim 1, wherein the composition comprises only the polyamide-block graft copolymer and a metal salt of alkyl alkylphosphonic acid.

8. The composition as claimed in claim 1, wherein said composition comprises, in addition, at least one coupling agent.

9. An encapsulant film for a photovoltaic module, the film comprising the composition as claimed in claim 1.

10. A photovoltaic module having at least two films, including at least one film that forms an encapsulant, comprising a photovoltaic cell capable of generating electrical energy, the encapsulant film being formed by the claim 1.

11. The composition as claimed in claim 1, wherein the molar mass of the polyamide grafts is within the range extending from 2000 to 3000 $g.mol^{-1}$.

* * * * *